US008363774B2

(12) United States Patent
Lin et al.

(10) Patent No.: US 8,363,774 B2
(45) Date of Patent: Jan. 29, 2013

(54) METHODS AND APPARATUSES OF SERIAL LINK TRANSCEIVER WITHOUT EXTERNAL REFERENCE CLOCK

(75) Inventors: Chia-Liang Lin, Fremont, CA (US); Gerchih Chou, San Jose, CA (US); Hong-Yean Hsieh, Santa Clara, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 456 days.

(21) Appl. No.: 12/691,847

(22) Filed: Jan. 22, 2010

(65) Prior Publication Data
US 2011/0182390 A1     Jul. 28, 2011

(51) Int. Cl.
 *H04L 7/00*     (2006.01)
(52) U.S. Cl. .......................................... 375/371; 331/10
(58) Field of Classification Search .................... 331/10, 331/57; 375/344, 371, 373
See application file for complete search history.

(56) References Cited

U.S. PATENT DOCUMENTS

| 5,894,246 | A | * | 4/1999 | Barnett et al. ................... 331/10 |
| 5,912,926 | A | * | 6/1999 | Koenck et al. ................. 375/295 |
| 7,496,161 | B2 | | 2/2009 | Chou et al. |
| 8,164,519 | B1 | * | 4/2012 | Bedoya Martinez et al. ......................... 342/357.69 |
| 2007/0066265 | A1 | * | 3/2007 | May ............................... 455/307 |
| 2007/0217559 | A1 | * | 9/2007 | Stott et al. ...................... 375/355 |
| 2008/0130816 | A1 | * | 6/2008 | Martin et al. .................. 375/373 |
| 2008/0174379 | A1 | * | 7/2008 | Chen .......................... 331/177 V |
| 2009/0039968 | A1 | * | 2/2009 | Thomsen et al. ................ 331/10 |

* cited by examiner

*Primary Examiner* — Leon-Viet Nguyen
(74) *Attorney, Agent, or Firm* — McClure, Qualey & Rodack, LLP

(57) ABSTRACT

A representative method of serial link transceiver without external reference clock is disclosed. The method includes: receiving an incoming signal; generating a local timing under control of a control code; generating a temperature sensor code by sensing a local temperature; generating a logical signal by detecting a presence of the incoming signal; adjusting the control code in a closed loop manner to make the local timing match that of the incoming signal and recording the control code and a value of the temperature sensor code as part of a template when the logical signal is asserted; and synthesizing the control code in accordance with the template when the logical signal is not asserted.

21 Claims, 3 Drawing Sheets

METHODS AND APPARATUSES OF SERIAL LINK TRANSCEIVER WITHOUT EXTERNAL REFERENCE CLOCK

BACKGROUND

1. Technical Field

The disclosure relates to serial link transceivers.

2. Description of Related Art

As depicted in FIG. 1, a prior art serial link transceiver 100 comprises a receiver 110 and a transmitter 120 for performing a receiving and a transmitting function, respectively. The receiver 110 comprises a clock-data recovery (CDR) circuit 102 for receiving an incoming signal RX_IN and outputting a recovered data RX_DATA signal and a recovered clock signal RX_CLK. The transmitter 120 comprises: a clock-multiplying unit (CMU) 124 for receiving a reference clock signal REF_CLK generated by an external crystal oscillator 130 and outputting a derived clock signal TX_CLK; and a modulator 126 for receiving the derived clock signal TX_CLK and an outgoing data signal TX_DATA and outputting an outgoing signal TX_OUT. The receiver 110 and the transmitter 120 operate in separate clock domains. The receiver recovers the clocking embedded in the incoming signal RX_IN and operates in accordance with the recovered clock signal RX_CLK. The transmitter operates in accordance with the reference clock signal REF_CLK generated by the crystal oscillator 130. Due to the high quality factor of the crystal oscillator, the timing of the reference clock is highly accurate and stable under environmental temperature drift. However, crystal oscillators are expensive and not typically considered amenable to integration in modern integrated circuit technology.

BRIEF SUMMARY

In an exemplary embodiment, a method is disclosed, the method comprising: receiving an incoming signal; generating a logical signal by detecting a presence of the incoming signal; generating a reference clock using a digitally controlled oscillator under control of a control code; generating a timing error signal by detecting a timing difference between the reference clock signal and a timing embedded in the incoming signal; generating a first intermediate code by filtering the timing error signal; generating a temperature sensor code by sensing a local temperature around the digitally controlled oscillator; mapping the temperature sensor code into a second intermediate code in accordance with a template; updating the template when the logical signal is asserted; selecting the first intermediate code as the control code when the logical signal is asserted; and selecting the second intermediate code as the control code when the logical signal is not asserted.

In another exemplary embodiment, a method is disclosed, the method comprising: receiving an incoming signal; generating a local timing under control of a control code; generating a temperature sensor code by sensing a local temperature; generating a logical signal by detecting a presence of the incoming signal; adjusting the control code in a closed loop manner to make the local timing match that of the incoming signal and recording the control code and a value of the temperature sensor code as part of a template when the logical signal is asserted; and synthesizing the control code in accordance with the template when the logical signal is not asserted.

In an exemplary embodiment, an apparatus is disclosed, the apparatus comprising: a signal detector for generating a logical signal by detecting a level of an incoming signal; a digitally controlled oscillator for generating a reference clock signal under control of a control code; a temperature sensor for generating a temperature sensor code by sensing a local temperature at the digitally controlled oscillator; a timing detector for generating a timing error signal by detecting a timing difference between the reference clock signal and a timing embedded in the incoming signal; a filter for generating a first intermediate code by filtering the timing error signal; a temperature compensator for mapping the temperature sensor code into a second intermediate code; and a multiplexer for generating the control code by choosing one of the first intermediate code and the second intermediate code in accordance with the logical signal.

DETAILED DESCRIPTION

Methods and apparatuses involving the use of serial link transceivers without external reference clocks are provided. While the specification describes several example embodiments that may be considered to be the best modes currently contemplated for practicing the invention, it should be understood that various other embodiments can be implemented in many ways and are not limited to the particular examples described below or to the particular manner in which any features of such examples are implemented. In other instances, well-known details are not shown or described to avoid confusion.

Figure 1:
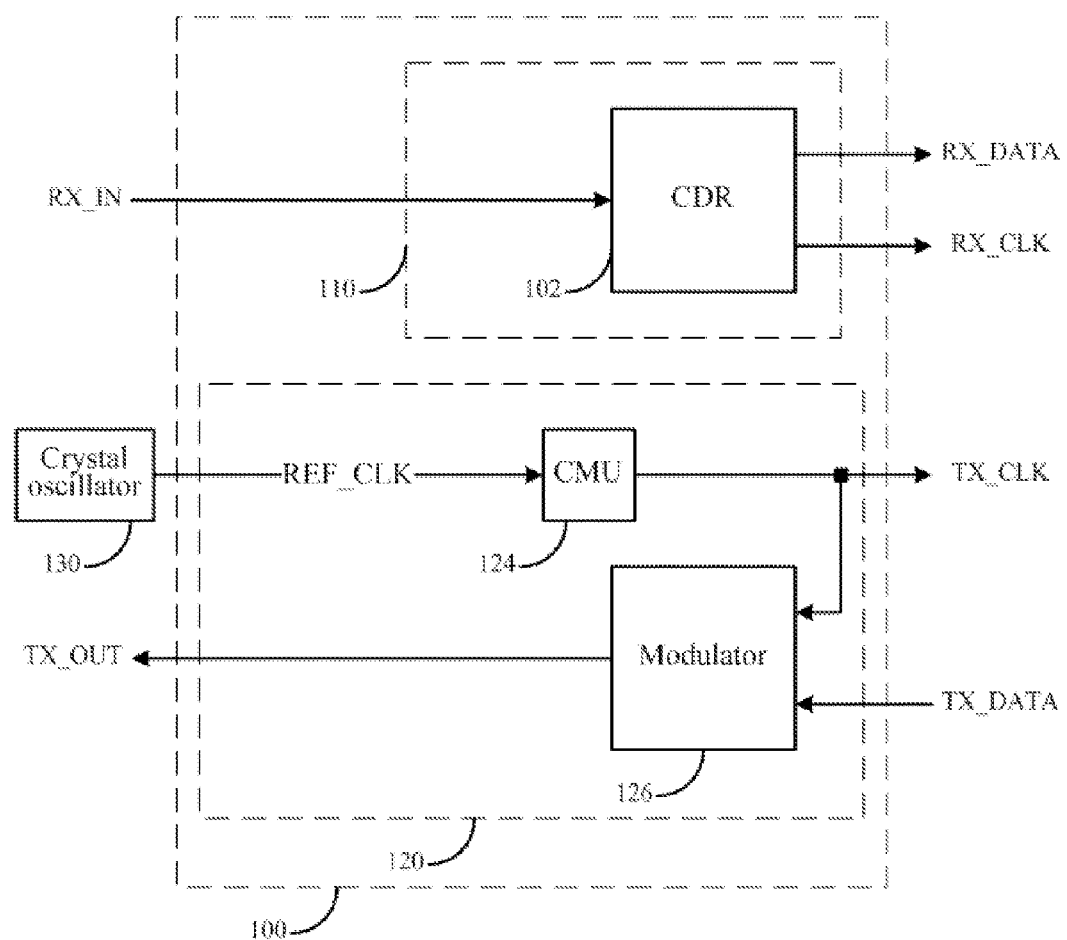
FIG. 1 shows a functional block diagram of a prior art serial link receiver.
Figure 2A:
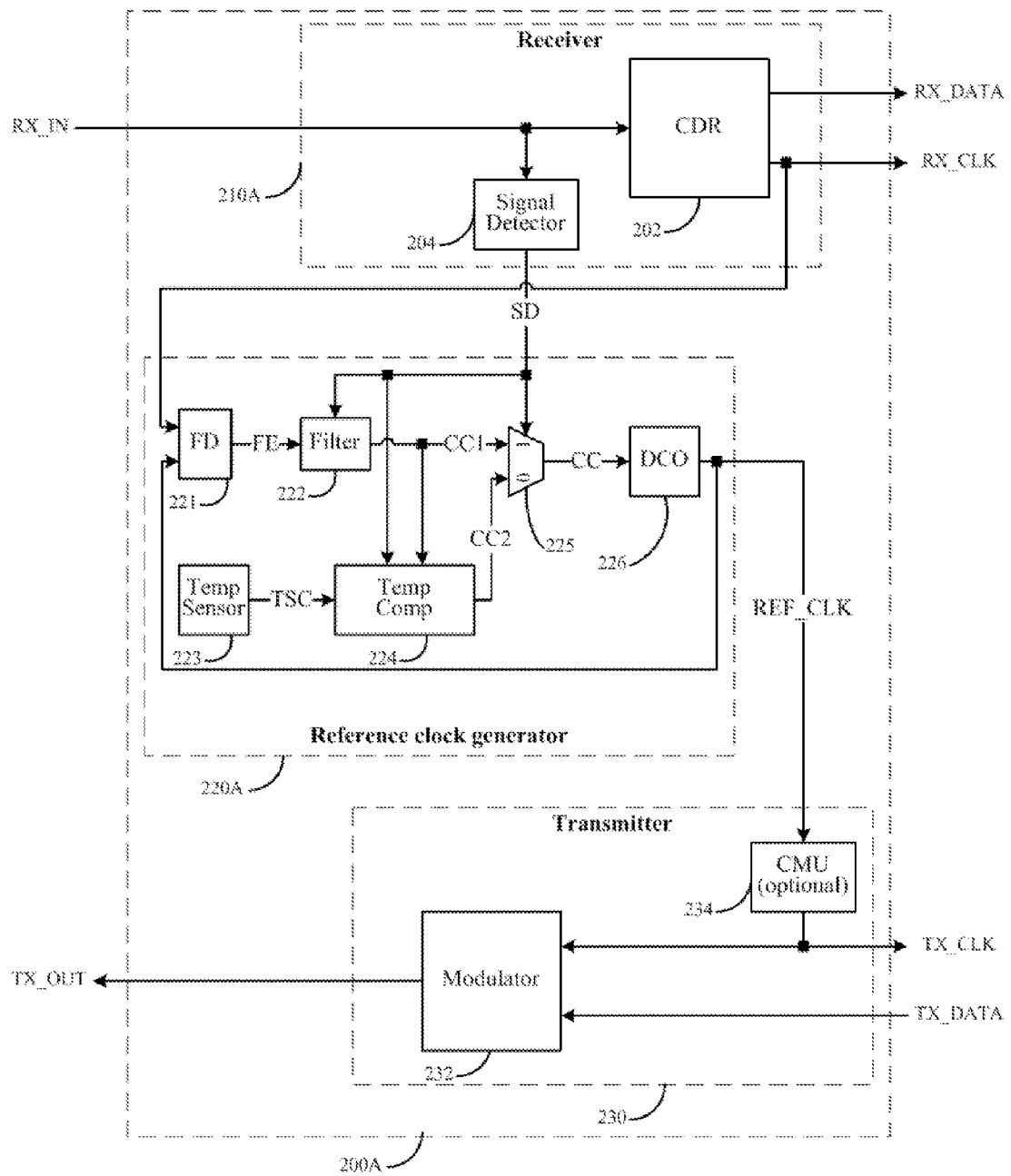
FIG. 2A shows a functional block diagram of an exemplary embodiment of a serial link transceiver.

A functional block diagram of an embodiment of a serial link transceiver 200A is depicted in FIG. 2A. The serial link transceiver 200A comprises: a receiver 210A for receiving an incoming signal RX_IN and for outputting a recovered data signal RX_DATA, a recovered clock signal RX_CLK, and a logical signal SD; a reference clock generator 220A for receiving the recovered clock signal RX_CLK and the logical signal SD and for outputting an internal reference clock signal REF_CLK; and a transmitter 230 for receiving an outgoing data signal TX_DATA and the reference clock signal REF_CLK and for outputting a derived clock signal TX_CLK and an outgoing signal TX_OUT. The receiver 210A comprises: a clock-data recovery circuit (CDR) 202 for generating the recovered clock signal RX_CLK and the recovered data signal RX_DATA; and a signal detector 204 for generating the logical signal SD, which is asserted whenever the signal detector 204 detects a presence of the incoming signal RX_IN and not asserted otherwise. The transmitter 230 comprises an optional clock-multiplying unit (CMU) 234 for generating the derived clock signal TX_CLK from the internal reference clock signal REF_CLK, and a modulator 232 for generating the outgoing signal TX_OUT by modulating the derived clock signal using the outgoing data signal TX_DATA. When the CMU 234 is not used, the derived clock signal TX_CLK is the same as the internal reference clock signal REF_CLK. The transceiver 200A differs from the prior art transceiver 100 of FIG. 1 in at least one respect in that transceiver 200A does not require an external clock reference but instead generates the internal reference clock signal REF_CLK on its own by the reference clock generator 220A.

With reference to FIG. 2A, the reference clock generator 220A comprises: a digitally controlled oscillator (DCO) 226 for generating the internal reference clock signal REF_CLK in accordance with a control by a control code CC; a frequency detector FD 221 for detecting a frequency error between the recovered clock signal RX_CLK and the internal reference clock signal REF_CLK and representing the error by an internal signal FE; a filter 222 for generating a first intermediate code CC1 by filtering the internal signal FE; a temperature sensor 223 for outputting a temperature sensor code TSC based on sensing a local temperature in a vicinity of DCO 226. A temperature compensation circuit 224 for outputting a second intermediate code CC2 based on the first intermediate code CC1 and the temperature sensor code TSC; and a multiplexer 225 for outputting the control code CC by selecting between the first intermediate code CC1 and the second intermediate code CC2 in accordance with the logical signal SD.

It should be noted that some embodiments may be suited for applications in which a link partner of the transceiver 200A has a highly accurate reference clock (e.g. a reference clock from a highly accurate and stable crystal oscillator). In a non-limiting example of such an embodiment, when the incoming signal RX_IN is present, the incoming signal RX_IN originates from the link partner in accordance with the highly accurate reference clock and therefore the recovered clock signal RX_CLK extracted from the incoming signal is also highly accurate, at least in a sense of statistical average. On the other hand, due to lack of a highly accurate local reference clock, the internal reference clock signal REF_CLK may not be very accurate. However, the frequency error between the recovered clock signal RX_CLK and the internal reference clock signal REF_CLK is detected by the frequency detector FD 221 and represented by the internal signal FE, which is subsequently filtered by the filter 222. The filter 222 comprises an integrator and performs a statistical average. When the internal signal FE is statistically positive, indicating that internal reference clock signal REF_CLK has a lower than desired frequency with respect to recovered clock signal RX_CLK, the first intermediate code CC1 is increased; the control code CC is therefore increased, leading to an increase to the frequency of the internal reference clock signal REF_CLK. In an embodiment, the oscillation frequency of DCO 226 monotonically increases as the control code CC increases under the same local temperature. When the internal signal FE is statistically negative, indicating that internal reference clock signal REF_CLK has a higher than desired frequency with respect to recovered clock signal RX_CLK, the first intermediate code CC1 is decreased; the control code CC is therefore decreased, leading to a decrease to the frequency of the internal reference clock signal REF_CLK. In this manner, the control code CC is established in a closed loop manner in the presence of the incoming signal RX_IN to ensure the frequency of the internal clock signal REF_CLK is statistically the same as the reference frequency embedded in the incoming signal RX_IN that is extracted and represented by the recovered clock signal RX_CLK. In an embodiment, DCO 226 is an oscillator that is stable in frequency when the local temperature is stable, but the frequency will drift away when the local temperature drifts away. However, in a closed-loop manner, the frequency of the DCO 226 is adjusted to match that of the timing embedded in the incoming signal RX_IN.

The temperature compensation circuit 224 maps the temperature sensor code TSC into the second intermediate code CC2 based on a template. In an embodiment, the template is periodically updated when the incoming signal is present (i.e. the logical signal SD is asserted). That is, a current value of the local temperate and the control code CC that is needed for the DCO 226 to have the same frequency as that embedded in the incoming signal RX_IN are recorded as part of the template. In an embodiment, the template comprises a lookup table that is periodically updated when the incoming signal is present (i.e. the logical signal SD is asserted). The lookup table tabulates a mapping between the first internal code CC1 and the temperature sensor code TSC. As the local temperature drifts, a value of the temperature sensor code changes, and a corresponding value of the control code CC needed for the frequency of DCO 226 to match that of the timing embedded in the incoming signal RX_IN also changes. These changes are recorded and make up of ("as part of"?) the template. When the incoming signal RX_IN is not present, the recovered clock signal RX_CLK is not meaningful and the logical signal SD is not asserted. Upon a de-assertion of the logical signal SD, the filter 222 and the template are frozen. When the incoming signal RX_IN is not present (and therefore the logical signal SD is not asserted), the temperature compensation circuit 224 output the second intermediate code CC2 and therefore the control code CC based on the template. In an embodiment, a linear interpolation (or extrapolation if applicable) is performed based on two entries in the lookup table of the template that are closest to the current value of the temperature sensor code. For instance, an exemplary lookup table upon the de-assertion of the logical signal SD is shown below:

| TSC | CC1 |
|---|---|
| 20 | 3010 |
| 31 | 4011 |
| 35 | 4513 |
| 40 | 5013 |

Then, if the temperature drifts and the TSC code becomes 25, then CC2 may be set based on a linear interpolation of two closest entries (TSC=20 and TSC=31):
CC2=3010+(25−20)(4011−3010)/(31−20)

In this manner, the frequency drift of the DCO 226 due to the local temperature drift is corrected. As long as the temperature drift dictates the frequency drift of the DCO 226, the internal reference clock signal REF_CLK remains accurate in the absence of the incoming signal RX_IN. In some embodiments, in a case where there is only a single entry on the lookup table and therefore a two-point interpolation (or extrapolation) is not possible, another technique, such as a linear mapping with a presumed slope, may be used to map the temperature sensor code TSC into the second intermediate code CC2.

It should be noted that the building blocks of the transceiver 200A are well known to those of ordinary skills in the art and thus no detailed descriptions are given here; however, it should also be understood that there is no intention to limit the disclosed concept to conventional components. In an embodiment, DCO 226 comprises a LC oscillator with a fixed inductor and a variable capacitor comprising an array of capacitors controlled by the control code CC; the total effective capacitor and consequently the oscillation frequency of the oscillator are controlled by the control code. In an embodiment, the frequency detector FD 221 comprises two counters for counting number of clock edges, one for the recovered clock signal RX_CLK and one for the internal reference clock signal REF_CLK. Both counters are periodically reset and upon reset the two counter values are compared and the frequency error signal FE is generated accordingly. For instance, both RX_CLK and REF_CLK have a nominal frequency of 5 GHz and the two clocks are reset for every 100,000,000 cycles of RX_CLK. Upon reset, the counter value for RX_CLK will be 100,000,000, if the counter value for REF_CLK is less (more) than 100,000,000 then PE is positive (negative) and therefore CC1 should be increased (decreased). In an embodiment, signal detector 202 comprises a rectifier, a low-pass filter, and a comparator. The incoming signal is rectified, filtered, and then compared to a threshold value. If the filtered output is less than the threshold, it indicates the signal is not present.

Figure 2B:
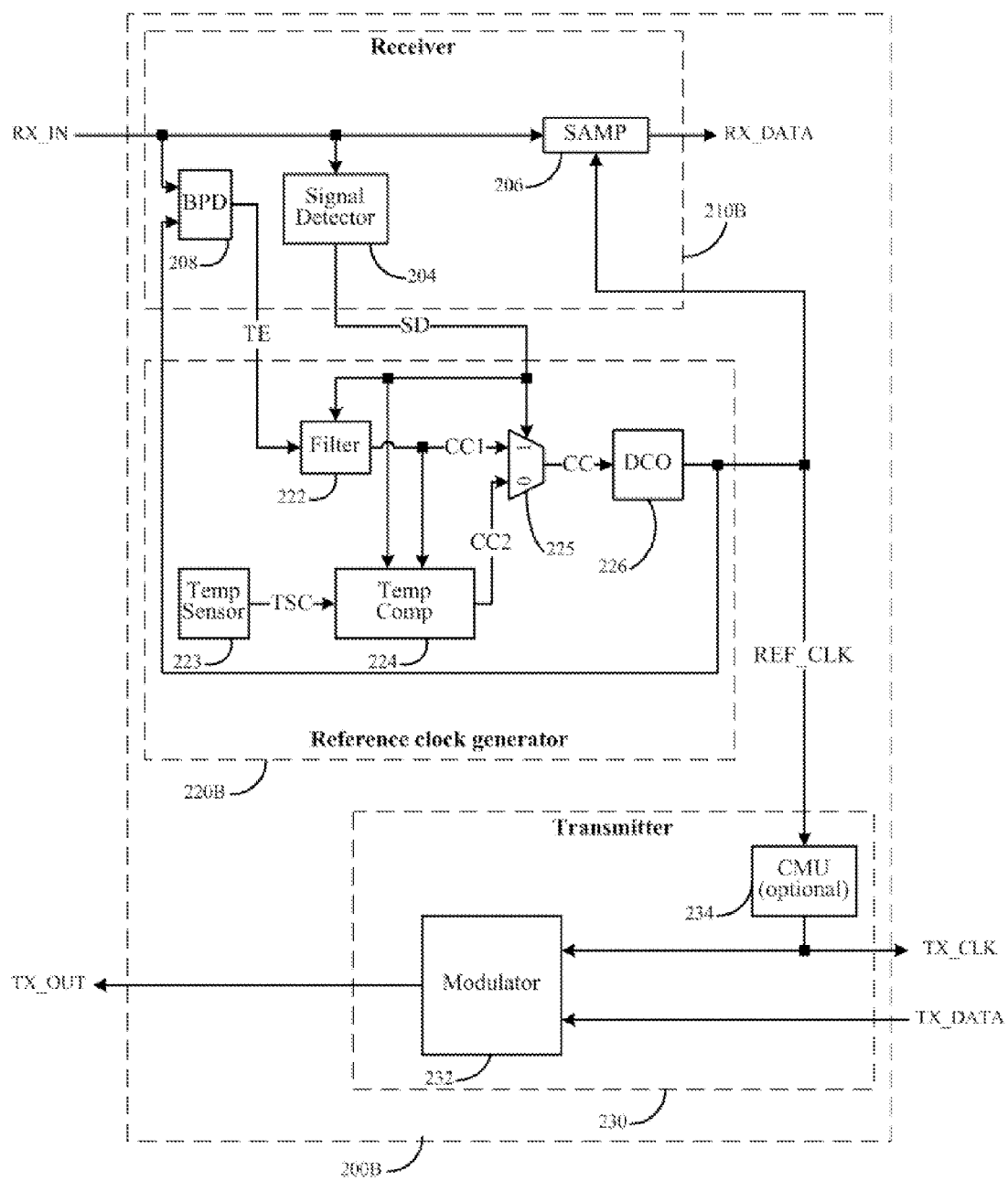
FIG. 2B shows a functional block diagram of another exemplary embodiment of a serial link transceiver.

In the embodiment of FIG. 2A, a CDR unit 202 is used to generate the recovered clock signal RX_CLK, which carries timing information embedded in the incoming signal RX_IN. A typical CDR circuit comprises: a binary phase detector (BPD) for generating a phase error signal by detecting a timing difference between the incoming signal RX_IN and the recovered clock signal RX_CLK, a filter for generating a control signal by filtering the phase error signal, and a controlled oscillator for generating the recovered clock signal RX_CLK under a control of the control signal, and a sampler for generating the recovered data signal RX_DATA by sampling the incoming signal RX_IN using the recovered clock signal RX_CLK. The timing information embedded in the incoming signal RX_IN is thus extracted and represented by the recovered clock signal RX_CLK. A frequency comparison between the received clock signal RX_CLK and the reference clock signal REF_CLK is performed to establish the control code CC for DCO 226 to ensure the reference clock signal REF_CLK has statistically the same frequency as the recovered clock signal RX_CLK. Since CDR 202 and the reference clock generator 220A have some functions that are very similar in nature (e.g. phase or frequency comparison, filter, controllable oscillator), it is possible to consolidate some similar functions. An alternative embodiment 200B, as depicted FIG. 2B, comprises an alternative receiver 210B comprising a BPD 208 for generating a timing error signal TE by detecting a timing difference between the incoming signal RX_IN and the reference clock signal REF_CLK, and a sampler 206 for sampling the incoming signal using the reference clock signal REF_CLK to generate the recovered data signal RX_DATA. The timing error signal TE is then used to replace the internal signal FE in embodiment 200A of FIG. 2A. In this embodiment, the recovered clock signal RX_CLK is consolidated with the reference clock signal REF_CLK, and the controlled code CC1 (for DCO 226 when the incoming signal RX_IN is present) is established directly by comparing a timing difference between the incoming signal RX_IN and the reference clock signal REF_CLK. In general, a template (comprising a condition of the local temperature and a local timing) is established and updated in the presence of the incoming signal, and the template is used to control a local timing in the absence of the incoming signal.

Those skilled in the art will readily observe that numerous modifications and alterations of the device and method may be made. Accordingly, the above disclosure should be construed as limited only by the metes and bounds of the appended claims.

What is claimed is:

1. An apparatus comprising:
a signal detector for generating a logical signal by detecting a presence of an incoming signal;
a digitally controlled oscillator for generating a reference clock signal under control of a control code;
a temperature sensor for generating a temperature sensor code by sensing a local temperature at the digitally controlled oscillator;
a timing detector for generating a timing error signal by detecting a timing difference between the reference clock signal and a timing embedded in the incoming signal;
a filter for generating a first intermediate code by filtering the timing error signal;
a temperature compensator for mapping the temperature sensor code into a second intermediate code; and
a multiplexer for generating the control code by choosing one of the first intermediate code and the second intermediate code in accordance with the logical signal.

2. The apparatus of claim 1, wherein the temperature compensator comprises a lookup table for mapping the temperature sensor code into the second intermediate code, the lookup table comprising two fields: temperature sensor code, and a corresponding value of the first intermediate code.

3. The apparatus of claim 2, wherein the lookup table is periodically updated responsive to the logical signal being asserted.

4. The apparatus of claim 3, wherein the second intermediate code is generated based on the lookup table using either an interpolation or an extrapolation from two entries that are closest to a present value of the temperature sensor code.

5. The apparatus of claim 1, wherein the filter comprises an integrator.

6. The apparatus of claim 1, wherein the timing detector is a binary phase detector detecting a timing relationship between the incoming signal and the reference clock signal.

7. The apparatus of claim 1, wherein the timing detector is a frequency detector detecting a difference in average frequency between the reference clock signal and a recovered clock signal recovered from the incoming signal from a clock-data recovery circuit.

8. The apparatus of claim 7, wherein the timing detector comprises a counter.

9. The apparatus of claim 1, wherein the signal detector comprises a rectifier, a low-pass filter, and a comparator.

10. The apparatus of claim 1, wherein the digitally controlled oscillator comprises a LC oscillator with a fixed inductor and a variable capacitor comprising an array of capacitors controlled by the control code CC.

11. A method comprising:
receiving an incoming signal;
generating a logical signal by detecting a presence of the incoming signal;
generating a reference clock signal using a digitally controlled oscillator under control of a control code;
generating a timing error signal by detecting a timing difference between the reference clock signal and a timing embedded in the incoming signal;
generating a first intermediate code by filtering the timing error signal;
generating a temperature sensor code by sensing a local temperature at the digitally controlled oscillator;
mapping the temperature sensor code into a second intermediate code;
selecting the first intermediate code as the control code when the logical signal is asserted; and
selecting the second intermediate code as the control code when the logical signal is not asserted.

12. The method of claim 11, wherein the mapping operation uses a lookup table that comprises at least two fields: temperature sensor code and a corresponding value of the control code for the reference clock to have the same frequency as that of the timing embedded in the incoming signal.

13. The method of claim 12, further comprising updating the lookup table responsive to the logical signal being asserted.

14. The method of claim 13, wherein the second intermediate code is generated based on the lookup table using either an interpolation or an extrapolation from two entries in the template that are closest to a present value of the temperature sensor code.

15. The method of claim 11, wherein filtering the timing error signal comprises integrating the timing error signal.

16. The method of claim 11, wherein the step of generating a timing error signal comprising using a binary phase detector detecting a timing relationship between the incoming signal and the reference clock signal.

17. The method of claim 11, wherein the step of generating a timing error signal comprises using a frequency detector detecting a difference in average frequency between the reference clock signal and a recovered clock signal recovered from the incoming signal from a clock-data recovery circuit.

18. The method of claim 17, wherein the frequency detector comprises a counter.

19. The method of claim 11, wherein the step of generating a logical signal by detecting a level of the incoming signal comprises using a rectifier, a low-pass filter, and a comparator.

20. The method of claim 11, wherein the digitally controlled oscillator comprises a LC oscillator with a fixed inductor and a variable capacitor comprising an array of capacitors controlled by the control code CC.

21. A method comprising:
receiving an incoming signal;
generating a local timing under control of a control code;
generating a temperature sensor code by sensing a local temperature;
generating a logical signal by detecting a presence of the incoming signal;
adjusting the control code in a closed-loop manner to make the local timing match a timing of the incoming signal and recording the control code and a value of the temperature sensor code as part of a look-up table when the logical signal is asserted; and
synthesizing the control code in accordance with the look-up table when the logical signal is not asserted.

* * * * *